(12) United States Patent
Kiguchi et al.

(10) Patent No.: US 6,599,582 B2
(45) Date of Patent: *Jul. 29, 2003

(54) PATTERN FORMATION METHOD AND SUBSTRATE MANUFACTURING APPARATUS

(75) Inventors: Hiroshi Kiguchi, Suwa (JP); Hitoshi Fukushima, Suwa (JP); Satoshi Nebashi, Suwa (JP); Tatsuya Shimoda, Suwa (JP)

(73) Assignee: Seiko Epson Corporation (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/232,682

(22) Filed: Jan. 19, 1999

(65) Prior Publication Data

US 2003/0003231 A1 Jan. 2, 2003

(30) Foreign Application Priority Data

Jan. 19, 1998 (JP) .......................................... 10-008016

(51) Int. Cl.[7] .................................................. B05D 1/04
(52) U.S. Cl. ....................... 427/466; 427/258; 427/261; 427/288
(58) Field of Search ................ 427/466, 469, 427/258, 261, 283, 288; 347/105–107, 19–20, 100

(56) References Cited

U.S. PATENT DOCUMENTS

| 3,982,251 | A |   | 9/1976 | Hochberg |
| 4,509,057 | A | * | 4/1985 | Sohl et al. |
| 4,891,242 | A | * | 1/1990 | Ito et al. |
| 5,132,248 | A |   | 7/1992 | Drummond et al. |
| 5,483,265 | A | * | 1/1996 | Kneezel et al. |
| 5,537,137 | A | * | 7/1996 | Held et al. |

FOREIGN PATENT DOCUMENTS

| CH | 673 290 |   | 4/1990 |
| EP | 0 671 268 |   | 9/1995 |
| EP | 671 268 A | * | 9/1995 |
| EP | 0 802 060 |   | 10/1997 |
| EP | 0 802 063 |   | 10/1997 |
| FR | 2 602 462 | * | 2/1988 |
| FR | 2 718 142 |   | 10/1995 |
| FR | 2602462 | * | 2/1998 |
| GB | 2 273 507 |   | 6/1994 |
| JP | 3-153385 |   | 7/1991 |
| JP | 6-286162 |   | 10/1994 |
| JP | 7-156534 |   | 6/1995 |
| JP | 8-52868 |   | 2/1996 |
| JP | 8-202043 |   | 8/1996 |
| JP | 9-29955 |   | 2/1997 |
| JP | 9-109381 |   | 4/1997 |
| JP | 9-279069 |   | 10/1997 |
| JP | 10-272827 |   | 10/1998 |
| JP | 10-278379 |   | 10/1998 |
| JP | 10-805504 |   | 12/1998 |
| WO | WO 89/05567 |   | 6/1989 |

OTHER PUBLICATIONS

European Search Report dated Dec. 17, 1999.

* cited by examiner

*Primary Examiner*—Fred J. Parker
(74) *Attorney, Agent, or Firm*—Harness, Dickey & Pierce, P.L.C.

(57) ABSTRACT

Provided is a substrate manufacturing technique for forming patterns on substrates with the aid of an ink-jet systems. Relates to a substrate manufacturing apparatus for forming arbitrary patterns on a substrate 1 from a fluid 11. This apparatus comprises an ink-jet print head 2 configured to allow the fluid 11 to be ejected onto the substrate 1; treatment means 3 for performing a specific treatment on the substrate 1; drive means 4 configured to allow the relative positions of the ink-jet print head 2, the treatment means 3, and the substrate 1 to be varied; and control means 5 for controlling the ejection of the fluid 11 from the ink-jet print head 2, the treatment performed by the treatment means 3, and the drive effected by the drive means 4. The control means 5 is configured to allow the treatment by the treatment means to be performed prior to the ejection of fluid from the ink-jet print head 2.

11 Claims, 13 Drawing Sheets

100 : SUBSTRATE MANUFACTURING APPARATUS

2: INK-JET PRINT HEAD

PATTERN FORMATION METHOD AND SUBSTRATE MANUFACTURING APPARATUS

BACKGROUND OF THE INVENTION

1. Field of the Invention

The present invention relates to a commercial use of an ink-jet print head, and more particularly to a manufacturing technique for forming arbitrary patterns with the aid of an ink-jet system.

2. Description of the Related Art

Substrates used in semiconductor processes or the like are formed from silicon and the like. Lithographic techniques and the like have been used in the past for manufacturing integrated circuits and the like from such silicon substrates.

A characteristic feature of the lithographic techniques is that a photosensitive material called resist is applied thinly to a silicon wafer, and an integrated circuit pattern produced by photolithography on a dry glass plate is transferred by being printed with the aid of light. Ions or the like are implanted into the transferred resist pattern, gradually forming wiring patterns or elements.

Because photolithography, resist application, exposure, development, and other steps are needed in order to be able to use the aforementioned lithographic techniques, fine patterns can only be produced at well-equipped semiconductor plants or the like. It is natural to expect, therefore, that the formation of fine patterns must involve complicated process control and high costs.

SUMMARY OF THE INVENTION

It should be noted that unlimited commercial demand exists for processes in which patterns on the order of micrometers (which do not quite reach the scale of VLSI or other such fine patterns) could be manufactured simply, inexpensively, and without the use of plants or other equipment.

The applicant already possesses technical expertise in the field of ink-jet systems in the form of technology for printing on paper. An ink-jet system uses an ink-jet print head for ink ejection. Such heads are configured in a way that allows the ink to be ejected from nozzles, and printing is performed by discharging the ink from the nozzles onto paper. Until now, ink-jet systems have primarily been used in printers for printing purposes.

An ink-jet print head can eject any fluid as long as this fluid has low viscosity. In addition, such an ink-jet print head has fine resolution (for example, 400 bpi). It is therefore believed that any pattern with a width on the order of micrometers could be formed if it were possible to eject commercially applicable fluids from the individual nozzles of an ink-jet print head. An ink-jet system does not require equipment such as plants.

It is, however, impossible to form patterns merely by configuring the system such that a fluid can be ejected from an ink-jet print head. This is because auxiliary treatments for fixing inks as patterns is needed in order to form patterns from such fluids. For example, chemical treatments for obtaining commercial materials from fluids, physical treatments for arranging pattern shapes, or physical-chemical treatments for accurately fixing pattern materials in pattern-forming regions are needed in order to fix patterns on substrates.

It is, however, impossible to realize the benefits offered by manufacturing substrates through the use of ink-jet systems in order to facilitate pattern formation because bulky manufacturing equipment is used in the treatment of such fluids.

In view of this, the inventors of the present application devised a technique whereby a pattern is subjected to the necessary treatments before and after ejection from an ink-jet print head, or the moment the ink is ejected during the formation of patterns with the aid of an ink-jet system.

Specifically, a first object of the present invention is to provide a method that allows patterns to be formed by enabling treatments to be performed before a fluid is ejected onto a substrate, and to provide a manufacturing apparatus therefor.

A second object of the present invention is to provide a method that allows patterns to be formed by enabling treatments to be performed after a fluid has been ejected onto a substrate, and to provide a manufacturing apparatus therefor.

A third object of the present invention is to provide a method that allows patterns to be formed by enabling treatments to be performed the moment a fluid is ejected onto a substrate, and to provide a manufacturing apparatus therefor.

The invention addressing the aforementioned first object resides in a pattern formation method for discharging a prescribed fluid onto a substrate from an ink-jet print head and forming an arbitrary pattern, and comprises a step for subjecting the aforementioned substrate to a specific treatment in advance before the aforementioned fluid is ejected, and a step for discharging the aforementioned fluid onto the aforementioned treated substrate from the aforementioned ink-jet print head.

As used herein, the term "fluid" refers to a medium that can be used not only for inks but also for other commercial applications, and that has a viscosity level that allows the fluid to be ejected from a nozzle. It is sufficient for the fluid to have a fluidity (viscosity) level that allows it to be ejected from a nozzle or the like; the fluid may be devoid of additives or may contain admixed solid matter. The ink-jet print head may belong to a system in which the fluid is ejected by the volume variations of a piezoelectric element, to a system in which the fluid is ejected as a result of the fact that vapors are rapidly formed by the application of heat, or to a system in which the fluid is ejected by electrostatic forces. The term "specific treatment" may refer to a chemical treatment, physical treatment, or physical-chemical treatment. These definitions are used in a similar manner below.

The invention addressing the aforementioned second object resides in a pattern formation method for discharging a prescribed fluid onto a substrate from an ink-jet print head and forming an arbitrary pattern, and comprises a step for discharging the prescribed fluid onto the substrate from the ink-jet print head, and a step for performing a specific treatment on the substrate onto which the fluid has been ejected.

The invention addressing the aforementioned third object resides in a pattern formation method for discharging a prescribed fluid onto a substrate from an ink-jet print head and forming an arbitrary pattern, and comprises a step for discharging the prescribed fluid from the ink-jet print head, and a step for performing a specific treatment on the droplets of the fluid thus ejected, before the fluid ejected from the ink-jet print head reaches the substrate.

The aforementioned treatment may, for example, be one that exerts chemical action on the fluid. The term "chemical action" refers to precipitation, a chemical reaction, or other action affecting a substance. An example of such a treatment is one in which the solubility of a prescribed substance contained in the fluid is lowered, and the substance is caused to precipitate. This treatment may, for example, be performed by subjecting the substrate or the fluid to a hot-air blast, laser irradiation, lamp irradiation, reduced pressure, or ambient variations (temperature or mist). This treatment may also be one in which a substance that induces chemical reactions in the fluid is ejected onto the substrate. Furthermore, this treatment may be one in which energy is supplied to droplets, and the concentration of the fluid is raised. Moreover, this treatment may be one in which energy is supplied to the droplets, and the trajectory of the droplets is curved.

The aforementioned treatment may, for example, be one that exerts physical action on the fluid. The term "physical action" refers to a mechanical, electrochemical, or magnetochemical effect on the fluid. This treatment may, for example, be one that is designed to align the borders of the ejected fluid with the borders of a pattern-forming region. This treatment may also be one in which excess fluid is absorbed by an absorbent as a result of the movement of the absorbent along the pattern-forming region.

The aforementioned treatment may, for example, be one that exerts physical-chemical action on the fluid. The term "physical-chemical action" refers to an effect on the fluid behavior from both physical and chemical actions. This treatment may, for example, be one in which the area of the substrate around the pattern-forming region is surface-modified to eliminate any affinity for the fluid. This treatment may also be one in which the pattern-forming region on the substrate is surface-modified to achieve affinity for the fluid. As used herein, the term "no affinity" refers to the property of having a comparatively large contact angle in relation to the fluid. The term "affinity" refers to a comparatively small contact angle in relation to the fluid. These expressions are contrasted with affinity in order to elucidate the behavior of films in relation to the fluid. This treatment is one in which the pattern-forming region on the substrate is surface-modified into an absorption layer for absorbing the fluid. This treatment may also be one in which banks for preventing the fluid from flowing out are formed around the pattern-forming region, and which further comprises a step for removing these banks following the formation of the pattern. Furthermore, this treatment may be one in which the same fluid is further ejected along a pattern region within which a fluid has already been ejected. Furthermore, this treatment may be one in which a substance that induces chemical reactions in the fluid is made to act on droplets. In addition, this treatment may also be one in which the attributes of the droplets are detected, and may further comprise a step for controlling the ejection of the droplets from the ink-jet print head on the basis of the droplet attributes thus detected.

The present invention, which resides in a substrate manufacturing apparatus for forming an arbitrary pattern on a substrate from a prescribed fluid, comprises an ink-jet print head configured to allow the fluid to be ejected onto the substrate; treatment means for performing a specific treatment on the substrate; drive means configured to allow the relative positions of the ink-jet print head, the treatment means, and the substrate to be varied; and control means for controlling the ejection of fluid from the ink-jet print head, the treatment performed by the treatment means, and the drive effected by the drive means. The control means is configured to allow the treatment by the treatment means to be performed prior to the ejection of fluid from the ink-jet print head.

In addition, the present invention, which resides in a substrate manufacturing apparatus for forming an arbitrary pattern on a substrate from a prescribed fluid, comprises an ink-jet print head configured to allow the fluid to be ejected onto the substrate; treatment means for performing a specific treatment on the substrate; drive means configured to allow the relative positions of the ink-jet print head, the treatment means, and the substrate to be varied; and control means for controlling the ejection of fluid from the ink-jet print head, the treatment performed by the treatment means, and the drive effected by the drive means. The control means is configured to allow the ejection of fluid from the ink-jet print head to be performed prior to the treatment carried out by the treatment means.

The present invention, which resides in a substrate manufacturing apparatus for forming an arbitrary pattern on a substrate from a prescribed fluid, comprises an ink-jet print head configured to allow the fluid to be ejected onto the substrate; treatment means for performing a specific treatment on the droplets of the fluid ejected from the ink-jet print head before these droplets reach the substrate; drive means configured to allow the relative positions of the ink-jet print head, the treatment means, and the substrate to be varied; and control means for controlling the ejection of fluid from the ink-jet print head, the treatment performed by the treatment means, and the drive effected by the drive means.

The aforementioned treatment means may, for example, be configured to allow chemical action to be exerted on the fluid.

In addition, the treatment means is configured to allow the solubility of a prescribed substance contained in the fluid to be lowered, and the substance to be precipitated.

Furthermore, the treatment means is configured to allow a substance that induces chemical reactions in the fluid to be ejected onto the substrate.

Moreover, the treatment means is configured to allow physical action to be exerted on the fluid.

In addition, the treatment means is configured to allow the borders of the ejected fluid to be aligned with the borders of a pattern-forming region.

Furthermore, the treatment means comprises an absorbent, and the control means allows excess fluid to be absorbed by the absorbent as a result of the relative movement of the absorbent along the pattern-forming region.

Moreover, the treatment means is configured to allow physical-chemical action to be exerted on the fluid.

In addition, the treatment means is configured to allow the area of the substrate around the pattern-forming region to be surface-modified to eliminate any affinity for the fluid. The term "no affinity" refers to the property of having a comparatively large contact angle in relation to the fluid. These expressions are contrasted with affinity in order to elucidate the behavior of films in relation to the fluid.

Furthermore, the treatment means is configured to allow the pattern-forming region on the substrate to be surface-modified to achieve affinity for the fluid. As used herein, the term "affinity" refers to a comparatively small contact angle in relation to the fluid.

Moreover, the treatment means is configured to allow the pattern-forming region on the substrate to be surface-modified into an absorption layer for absorbing the fluid.

In addition, the treatment means is configured to allow banks for preventing the fluid from flowing out to be formed around the pattern-forming region, and this manufacturing apparatus further comprises means for removing these banks following the formation of the pattern.

The present invention, which resides in a substrate manufacturing apparatus for forming an arbitrary pattern on a substrate from a prescribed fluid, comprises an ink-jet print head configured to allow the fluid to be ejected onto the substrate, drive means configured to allow the relative positions of the substrate and the ink-jet print head to be varied, and control means for controlling the ejection of fluid from the ink-jet print head and the drive effected by the drive means. In the control means, the same fluid is further ejected from the ink-jet print head along a pattern region within which a fluid has already been ejected.

The treatment means may, for example, be configured to allow energy to be supplied to droplets, and the concentration of this fluid to be raised.

In addition, the treatment means is configured to allow energy to be supplied to droplets, and the trajectory of the droplets to be curved.

Furthermore, the treatment means is configured to allow a substance that induces chemical reactions in the fluid to be fed to the droplets.

Moreover, the treatment means is configured to allow the attributes of the droplets to be detected, and the control means controls the ejection of the droplets from the ink-jet print head and the drive performed by the drive mean on the basis of the droplet attributes detected by the treatment means.

DESCRIPTION OF THE PREFERRED EMBODIMENTS

The best mode for carrying out the present invention will now be described with reference to drawings.

Common Structure

Figure 1:
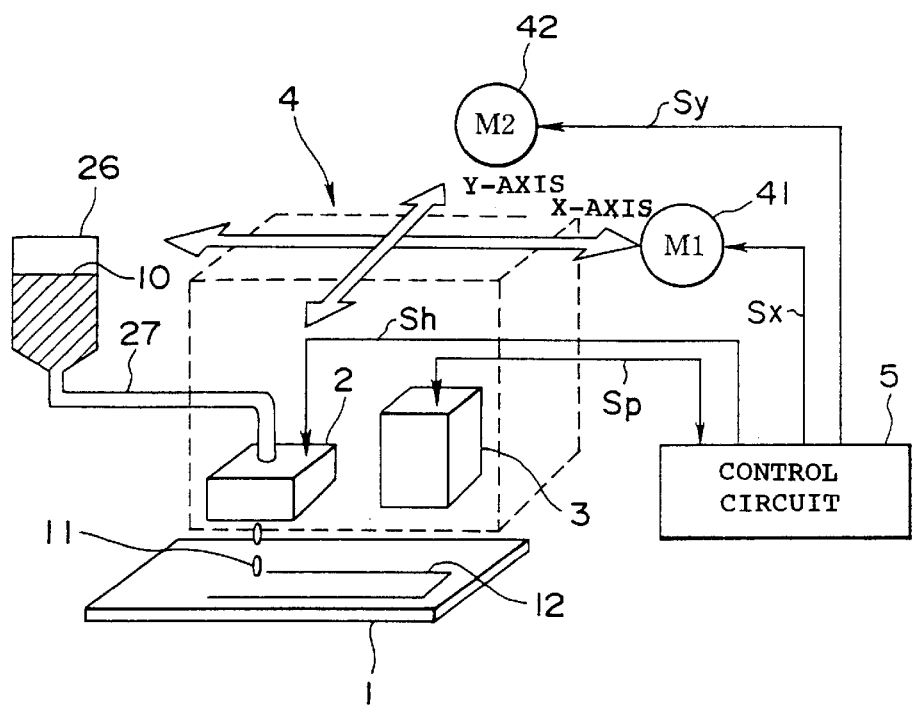
FIG. 1 is a block diagram of the substrate manufacturing apparatus in an embodiment of the present invention.

FIG. 1 is a schematic block diagram of the common components of the substrate manufacturing apparatus used in the embodiments that follow. As shown in FIG. 1, the substrate manufacturing apparatus 100 itself comprises an ink-jet print head 2, a treatment apparatus 3, a drive mechanism 4, and a control circuit 5. In the embodiments that follow, the configuration of the treatment apparatus 3 and the treatment specifics are different in each case, but the rest of the structure is substantially the same in all the embodiments.

An ink tank 26 filled with a fluid 10 is connected to the ink-jet print head 2 with a pipe 27 to allow the fluid 10 to be fed in. Any hydrophilic or hydrohobic fluid can be used as the fluid 10 as long as it has the fluidity that allows it to be ejected from the ink-jet print head. The entire composition may be other than fluid. It is possible, for example, to use a composition obtained by adding an electroconductive metal in the form of fine particles to a solvent.

Figure 18:
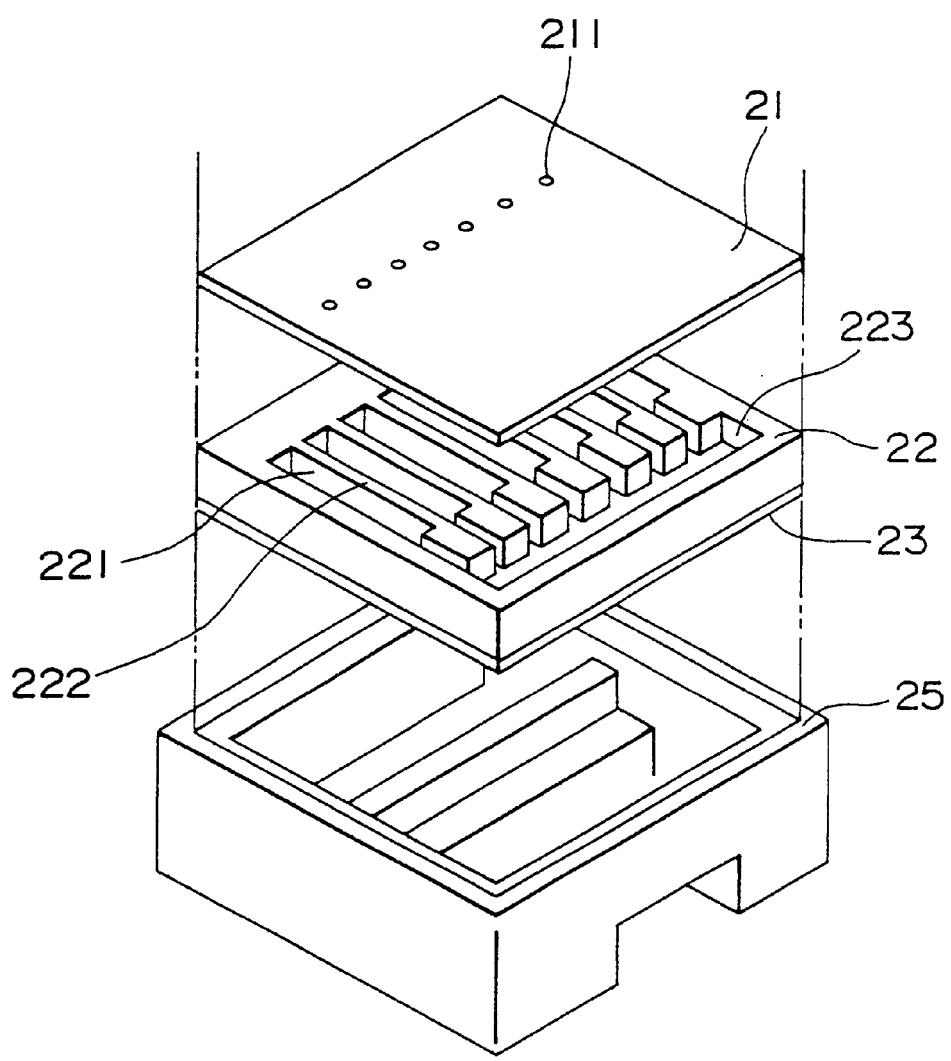
FIG. 18 is an exploded perspective view of an ink-jet print head.

The structure of the ink-jet print head will first be described. FIG. 18 is an exploded perspective view of the ink-jet print head 2. It is sufficient for the ink-jet print head 2 to be configured as a common ink-jet print head capable of discharging any fluid. The ink-jet print head 2 in FIG. 18 is obtained by fitting into a casing 25 a nozzle plate 21 equipped with nozzles 211, and a pressure chamber substrate 22 equipped with a diaphragm 23. The pressure chamber substrate 22 may, for example, be formed by silicon etching and provided with cavities (pressure chambers) 221, side walls 222, a reservoir 223, and the like.

Figure 19:
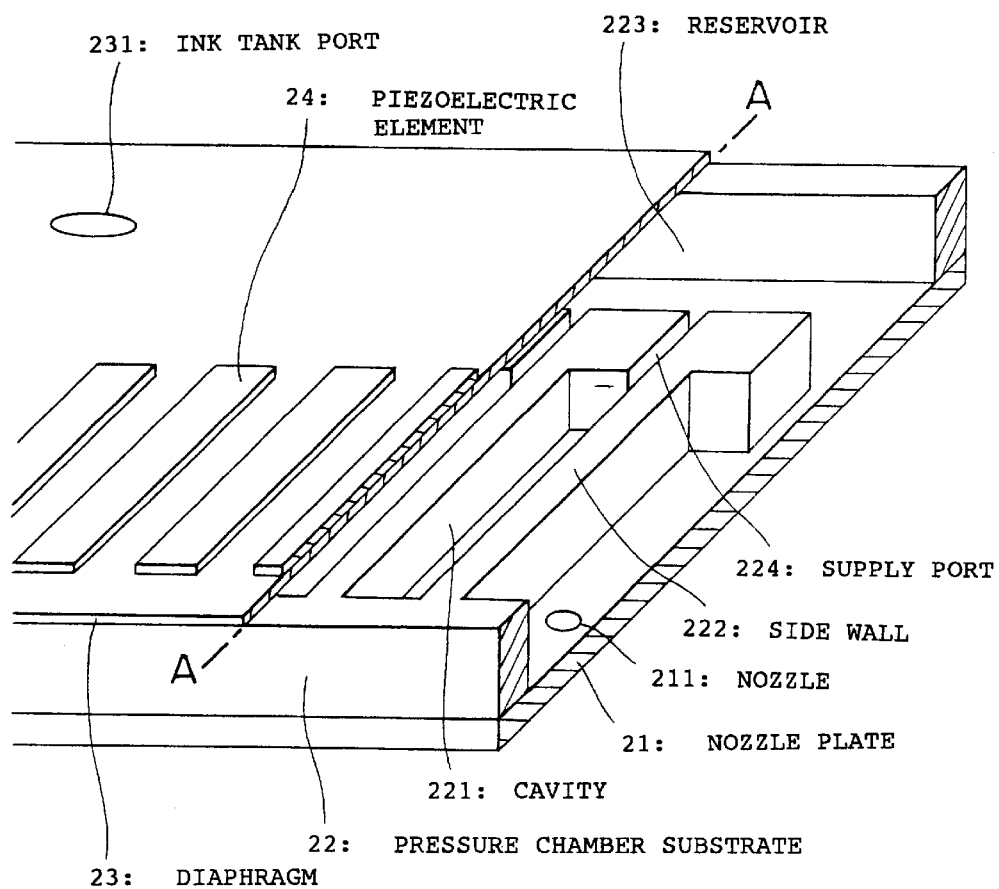
FIG. 19 is a perspective view/partial cross-sectional view of the main portion of the ink-jet print head.

FIG. 19 is a perspective view/partial cross-sectional view of the structure of the main portion of the ink-jet print head 2 obtained by stacking the nozzle plate 21, pressure chamber substrate 22, and diaphragm 23. As shown in the drawing, the main portion of the ink-jet print head 2 is configured such that the pressure chamber substrate 22 is sandwiched between the nozzle plate 21 and the diaphragm 23. The nozzles 211 in the nozzle plate 21 are formed such that their positions correspond to the cavities 221 when the plate is placed on top of the pressure chamber substrate 22. By etching a silicone monocrystal substrate or the like, the pressure chamber substrate 22 is provided with a plurality of cavities 221 capable of functioning as individual pressure chambers. The cavities 221 are separated by side walls 222. Each cavity 221 is connected by a supply port 224 to a reservoir 223, which is a common conduit. The diaphragm 23 may, for example, be composed of a thermally oxidized film or the like. Piezoelectric elements 24 are formed at positions corresponding to the cavities 221 on the diaphragm 23. The diaphragm 23 is also provided with an ink tank port 231 to allow any fluid 10 to be fed from the tank 26. The piezoelectric elements 24 may, for example, be configured such that PZT elements or the like are sandwiched between an upper electrode and a lower electrode (not shown). The piezoelectric elements 24 are configured such that volume variations can occur in accordance with the control signals Sh fed from the control circuit 5.

Although the above-described ink-jet print head was configured such that piezoelectric elements were caused to change their volume, and a fluid was ejected, it is also possible to use a head structure in which heat is applied to the fluid by a heater, and droplets are ejected by the resulting expansion.

The treatment apparatus 3 is configured to allow a prescribed treatment to be performed on a substrate 1. The treatment apparatus 3 performs the treatment in accordance with control signals Sp from the control circuit 5. The functions and structure of the treatment apparatus 3 will become apparent from the embodiments that follow.

The drive mechanism 4, which comprises a motor M1, a motor M2, and a mechanism structure (not shown), is configured to allow both the ink-jet print head 2 and the treatment apparatus 3 to be conveyed in the direction of the X-axis (transverse direction in FIG. 1) and in the direction of the Y-axis (depth direction in FIG. 1). Motor M1 is configured to allow the ink-jet print head 2 and the treatment apparatus 3 to be conveyed in the direction of the X-axis in accordance with drive signals Sx. Motor M2 is configured to allow the ink-jet print head 2 and the treatment apparatus 3 to be conveyed in the direction of the Y-axis in accordance with drive signals Sy.

It is sufficient for the drive mechanism 4 to be provided with a structure that allows the positions of the ink-jet print head 2 and treatment apparatus 3 to be varied relative to the substrate 1. It is therefore possible, in addition to the above-described structure, to use an arrangement in which the substrate 1 is moved in relation to the ink-jet print head 2 or the treatment apparatus 3, or an arrangement in which both the substrate 1 and the ink-jet print head 2 (and the treatment apparatus 3) are moved. Furthermore, certain types of treatment do not require that the treatment apparatus 3 be conveyed together with the ink-jet print head 2, and allow the treatment apparatus 3 to be conveyed or to remain stationary.

Figure 20:
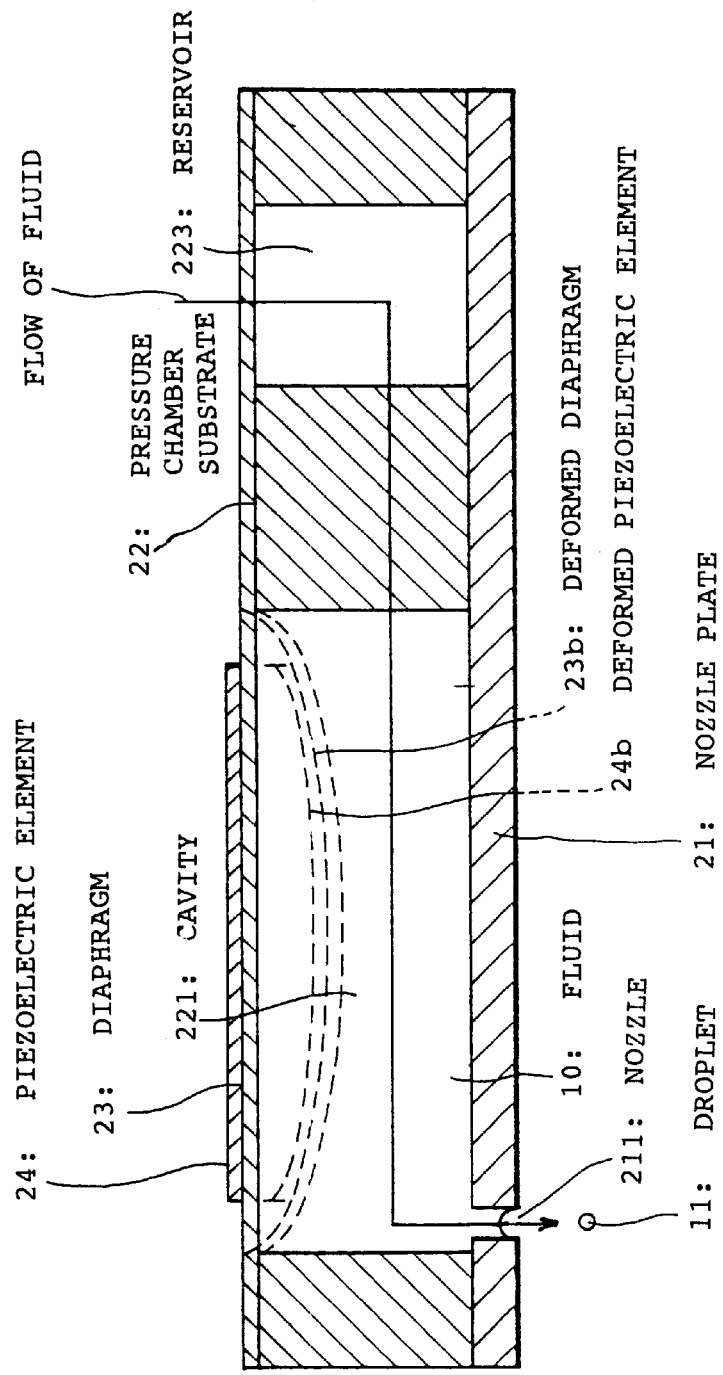
FIG. 20 is a diagram illustrating the ejection principle of the ink-jet print head.

The ejection principle of the ink-jet print head 2 is described with reference to FIG. 20. This drawing is a cross section along line A—A in FIG. 20. The fluid 10 is fed from the tank 26 into the reservoir 223 through the ink tank port 231 provided to the diaphragm 23. The fluid 10 flows from this reservoir 223 into each cavity 221 through the supply port 224. The volume of the piezoelectric element 24 varies when voltage is applied between the upper and lower electrodes thereof. This volume change deforms the diaphragm 23 and varies the volume of the cavity 221.

The diaphragm 23 remains undeformed in as long as no control signal Sh is provided or voltage applied. When a control signal Sh is provided and voltage applied, the diaphragm 23b or the post-deformation piezoelectric element 24b is deformed, reaching the position shown by the broken line in the figure. When the internal volume of the cavity 21 changes, the pressure of the fluid 10 in the cavity 21 rises. The fluid 10 is fed to the nozzle 211, and a droplet 11 is ejected.

Arrangement Aspects

Basic treatment arrangements of the present invention will be described with reference to FIGS. 2–4. The present invention will be described by considering three separate arrangements for the treatment apparatus used on the fluid ejected from the ink-jet print head.

Figure 2:
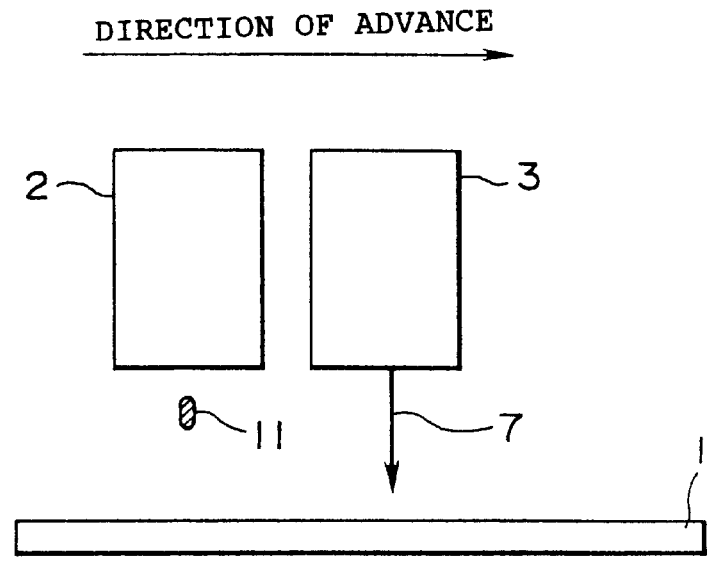
FIG. 2 is a diagram illustrating a first arrangement (pretreatment).

FIG. 2 is a concept diagram of a first arrangement for treating the substrate before the fluid is ejected from the ink-jet print head. As shown in the drawing, the ink-jet print head 2 and the treatment apparatus 3 are conveyed in a relative fashion in the conveyance direction designated by an arrow. In the first arrangement, the treatment apparatus 3 is disposed in front of the ink-jet print head 2 in the direction of advance. A prescribed treatment 7 is performed on the substrate 1 before droplets 11 of the fluid are ejected from the ink-jet print head 2 onto the substrate 1. Treatment specifics will be described with reference to an embodiment that follows.

Figure 3:
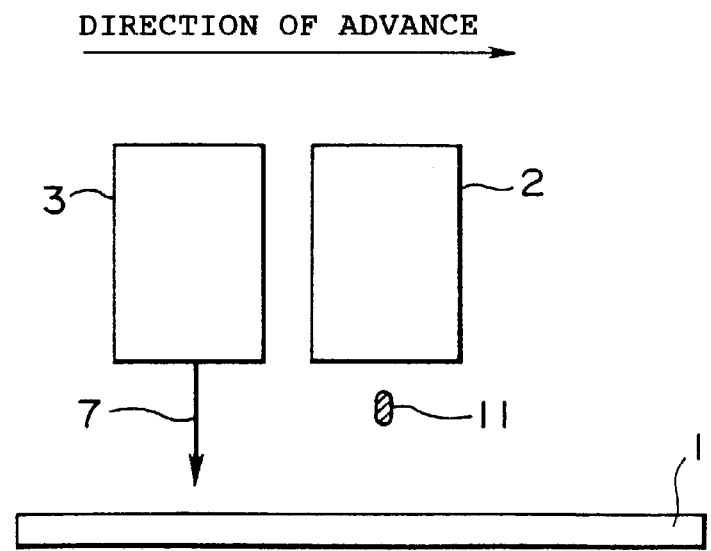
FIG. 3 is a diagram illustrating a second arrangement (aftertreatment).

FIG. 3 is a concept diagram of a second arrangement for treating the fluid or the substrate after the fluid has been ejected from the ink-jet print head. As shown in the drawing, the ink-jet print head 2 and the treatment apparatus 3 are conveyed in a relative fashion in the conveyance direction designated by an arrow. In the second arrangement, the treatment apparatus 3 is disposed behind the ink-jet print head 2 in the direction of advance. A prescribed treatment 7 is performed on the substrate 1 after droplets 11 of the fluid have been ejected from the ink-jet print head 2 onto the substrate 1. Treatment specifics will be described with reference to an embodiment that follows.

Figure 4:
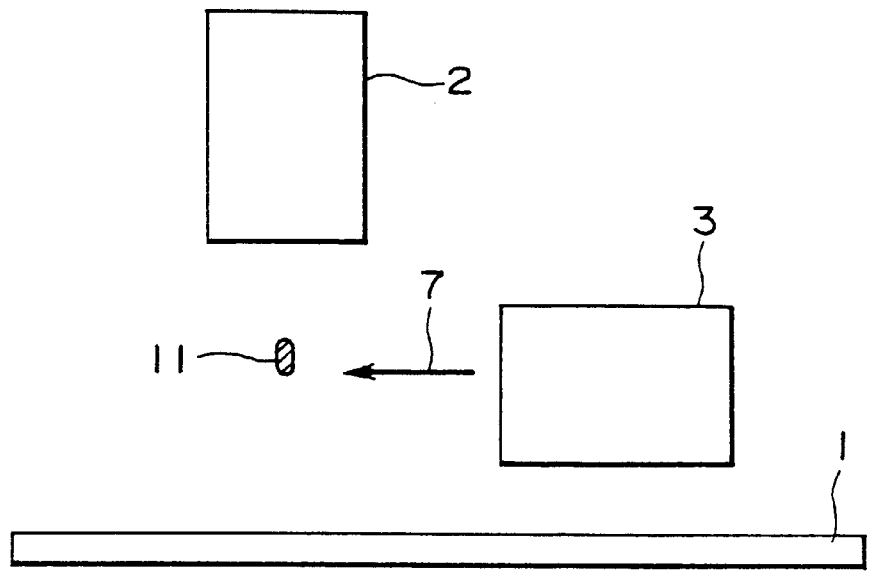
FIG. 4 is a diagram illustrating a third arrangement (a treatment that immediately follows ejection).

FIG. 4 is a concept diagram of a third arrangement for directly treating droplets of the fluid ejected from the ink-jet print head. In the third arrangement, the treatment apparatus 3 is disposed to allow direct treatment of the droplets 11 ejected from the ink-jet print head 2. A prescribed treatment 7 is performed on the droplets 11 of the fluid ejected from the ink-jet print head 2 before these droplets reach the substrate 1. Treatment specifics will be described with reference to an embodiment that follows.

Embodiment 1

Embodiment 1 of the present invention relates to a treatment that exerts action (reduction in solubility) on the fluid, and is primarily used in the first and second arrangements described above.

Figure 5:
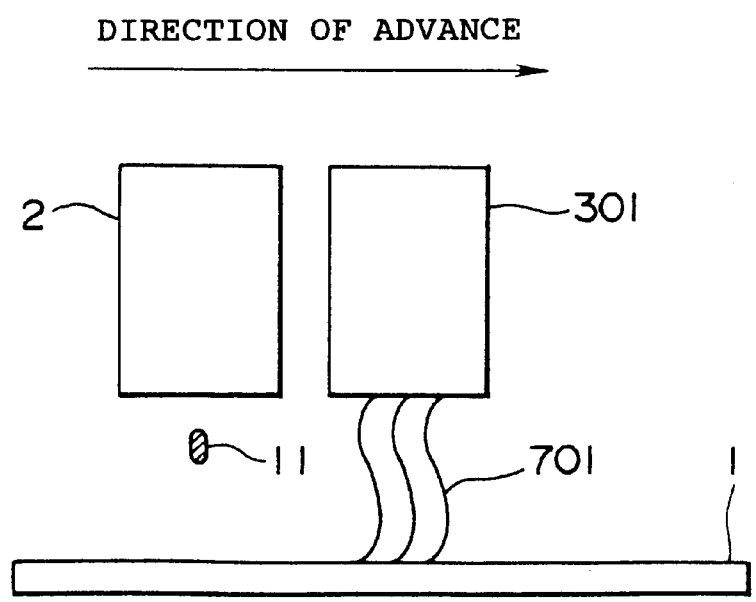
FIG. 5 is a side view depicting the treatment concept of Embodiment 1.

FIG. 5 is a side view illustrating the treatment concept of Embodiment 1. The treatment apparatus 301 of Embodiment 1 is configured such that a treatment 701 for lowering the solubility of substances admixed into the fluid and precipitating these substances as solids can be applied to the substrate 1 before a droplet 11 is ejected. A treatment in which a hot-air blast, laser irradiation, lamp irradiation, or the like is performed to vaporize the solvent components of the fluid can be suggested as such a treatment. Although the drawing depicts the structure utilized for the first arrangement, the treatment apparatus 301 can be disposed behind the ink-jet print head 2 in the direction of advance when the structure is utilized for the second arrangement.

When hot air is to be blown, the treatment apparatus 301 is equipped with a compressor for blowing air, a heat for heating the air, and the like. When laser irradiation is to be performed, the system is equipped with a laser light-emitting diode for generating laser light with a prescribed wavelength, a lens array for gathering the laser light, an actuator apparatus for driving the lens array and appropriately gathering the laser light on the substrate, and the like. When lamp irradiation is performed, the system is equipped with a xenon lamp (or other lamp capable of emitting high energies), a reflector, a lens array, and the like.

When the above-described treatment apparatus 301 is used in the first arrangement for performing pretreatments, the aforementioned treatment is performed on the substrate 1 immediately before a droplet 11 of the fluid is ejected.

Because the substrate 1 is already heated, the solvent components of a droplet reaching the substrate are vaporized immediately after the contact, and the fluid is concentrated, with the result that the solids remain or the dissolved product precipitates. When, for example, the fluid is obtained by adding fine metal particles to a solvent, the solvent components alone are vaporized by the action of heat, and the fine metal particles remain on the substrate as a conductive pattern.

When the above-described treatment apparatus 301 is used in the second arrangement for performing aftertreatments, the aforementioned treatment is performed on the droplets of fluid that have already been ejected onto the substrate. The dissolved product can be precipitated by the same action.

In addition to the above-described treatment, it is also possible to use a configuration that allows the atmosphere to be varied or the pressure to be lowered locally. Such a configuration makes it possible to lower the solubility of the dissolved product in the fluid and, as a result, to allow the dissolved product to precipitate. An arrangement in which the entire substrate is heated or the like can also be added to the modification examples of the present embodiment. A heating device or the like is therefore provided to the mounting platform of the substrate 1.

Thus, Embodiment 1 allows solids to be retained in, or precipitated from, the fluid by the application of energy, and patterns can be easily formed. In addition, the treatment apparatus merely performs heating locally, making it possible to reduce the size of the heating equipment and to curtail energy consumption.

Embodiment 2

Embodiment 2 of the present invention relates to a treatment that induces chemical action (chemical reaction) in the fluid, and is primarily used in the first and second arrangements described above.

Figure 6:
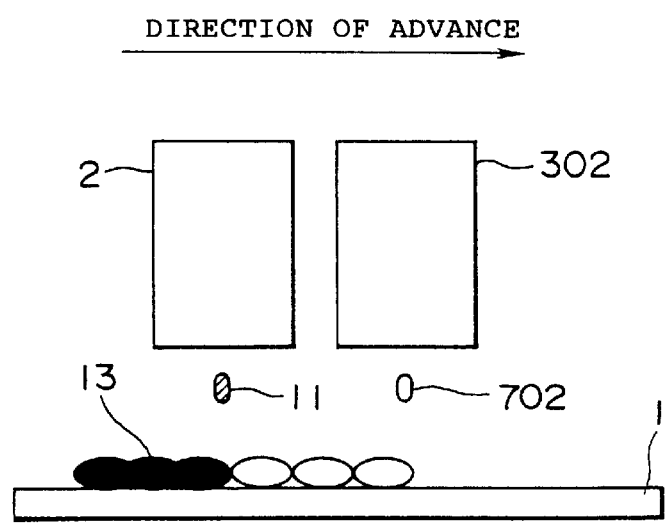
FIG. 6 is a side view depicting the treatment concept of Embodiment 2.

FIG. 6 is a side view illustrating the treatment concept of Embodiment 2. The treatment apparatus 302 of Embodiment 2 is configured such that a reaction solution 702 capable of breaking up a disperse system or initiating a chemical reaction in the fluid is ejected on the substrate 1 before the fluid 10 is ejected. The same structure as that of the ink-jet print head 2 should preferably be used as the treatment apparatus 302. This is because substantially the same amount of reaction solution as that of the fluid droplets 11 can be ejected in a controlled manner. Although the drawing depicts the structure utilized for the first arrangement, the treatment apparatus 302 is disposed behind the ink-jet print head 2 in the direction of advance when the structure is utilized for the second arrangement.

When an organic pigment dispersed with a styrene-acrylic resin is the principal component of the fluid droplets 11, discharging an aqueous solution of magnesium nitrate as the reaction solution 702 can be cited as an example of a treatment that breaks up a disperse system. In addition, when an epoxy resin is the principal component of the fluid droplets 11, discharging amines as the reaction solution 702 can be cited as an example of a treatment that initiates chemical reactions.

When the above-described treatment apparatus 302 is used in the first arrangement for performing pretreatments, the aforementioned reaction solution 702 is ejected within a pattern-forming region before the droplets 11 of fluid are ejected. The disperse system is broken up or chemical reactions are initiated and solid matter 13 is deposited when the droplets 11 impinge on the pattern-forming region within which the reaction solution 702 has been ejected. When, for example, the droplets 11 contain a metal salt, a conductive metal pattern can be formed by making use of a reaction solution 702 that is reactive with this salt.

When the above-described treatment apparatus 3 is used in the second arrangement for performing aftertreatments, the reaction solution 702 is ejected in relation to the droplets 11 of fluid that have already been ejected onto the substrate. The solid matter 13 can be formed by the same action.

Although two ink-jet print heads were used in the embodiments described above, the number of heads capable of discharging other reaction solutions should be increased in order to initiate more complicated reactions.

According to Embodiment 2, patterns can be formed merely by providing a plurality of ink-jet print heads because the disperse system can be broken up or chemical reactions initiated with a reaction solution, as described above. In particular, a plurality of heads having the same configuration should be provided, and solely the substance ejected therefrom should be varied, making it easier to design manufacturing apparatus.

Embodiment 3

Embodiment 3 of the present invention relates to a treatment for improving the affinity of the substrate as a physical-chemical action, and is primarily used in the first arrangement described above.

Figure 7:
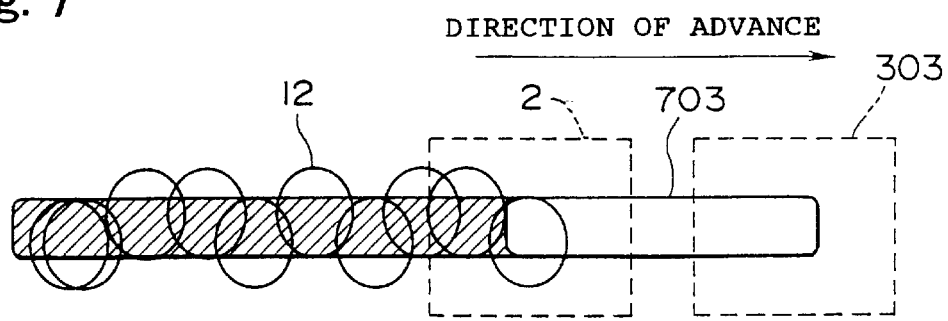
FIG. 7 is a plan view depicting the treatment concept of Embodiment 3.

FIG. 7 is a plan view illustrating the treatment concept of Embodiment 3. The treatment apparatus 303 of Embodiment 4 is configured such that the pattern-forming region of the substrate 1 can be surface-modified to achieve affinity for the fluid 10 before this fluid has been ejected onto the substrate.

The following methods can be used as surface modification treatments aimed at achieving affinity when the fluid contains polar molecules (moisture and the like): methods for applying silane coupling agents; methods for forming aluminum oxide, silica, and other porous films; and methods for performing reverse sputtering in argon or the like; as well as corona ejection treatments, plasma treatments, ultraviolet irradiation treatments, ozone treatments, degreasing treatments, and various other known methods. Methods for applying paraffin or the like, gas plasma treatments, coupling treatments, and the like may be used when the fluid is devoid of polar molecules.

When a silane coupling agent is used, the treatment apparatus 303 is configured such that it is possible to apply organosilicon compounds (silane coupling agents) having alkoxy groups, halogens, and other hydrolyzable substituent groups readily reactive toward inorganic substances, as well as vinyl groups, epoxy groups, and amino groups readily reactive toward organic substances. Ejection of materials from ink-jet print heads, and direct application with application mechanisms resembling ball-point pens can be suggested as an application method. When porous films are to be formed, the treatment apparatus 303 is configured to allow application of porous materials such as $Al_2O_3$ and silica. The application methods are the same as described above. A sputtering apparatus is used as the treatment apparatus 303 for a method involving reverse sputtering. Specifically, a cathode, an electrode in which the substrate serves as the anode, a mechanism for adjusting the argon atmosphere, a power source, and the like are provided. Through a reverse sputtering treatment, the substrate surface is activated, replacement with hydrophilic substituent groups is achieved, and the substrate surface is modified. When a corona discharge is used, a high-voltage discharge electrode is provided as the treatment apparatus 303, and a structure is set up such that ground voltage can be applied to the substrate 1. Some of the organic molecules of the substrate are replaced with hydrophilic groups, and the substrate surface is modified by the local application of high voltage to the surface. To perform a plasma treatment, the treatment apparatus 303 is configured such that it is possible to eject a plasma generated by a gas discharge. An ultraviolet irradiation lamp is provided as the treatment apparatus 303 when ultraviolet light is to be used for irradiation. When an ozone treatment is to be performed, the treatment apparatus 303 is configured such that a prescribed voltage can be applied in an atmosphere of circulating ozone, and the activated ozone can be released onto the substrate. When a degreasing treatment is to be performed, the treatment apparatus 303 is configured to allow permanganic acid, chromic acid, sulfuric acid, nitric acid, or another strong alkali to be fed to the substrate. When paraffin or the like is to be applied, an application mechanism resembling an ball-point pen is used for the treatment apparatus 303, and dissolved paraffin or the like is applied to a region centered on the two sides of the pattern-forming region.

If a silane coupling agent has been applied, the presence of the above-described treatment apparatus 303 causes the silane coupling agent, which has been applied to a pattern-forming region 703, to bond with the substrate material, whereas groups readily wettable by water are exposed on the surface. If a porous film has been formed, the aluminum oxide, silica, or other film formed in the pattern-forming region 703 is apt to contain fluid because of its porosity. If reverse sputtering has been performed, the surface temperature of the pattern-forming region rises, making it possible to improve film adhesion and to achieve transformation to a hydrophilic film. If a corona discharge has been generated, hydrophilic properties are achieved because of the formation of OH groups or COOH groups on the substrate surface. If a plasma treatment has been performed, the products are a cross-linked layer and unreacted groups of the macromolecules on the substrate surface. The unreacted groups are readily oxidized, yielding OH groups, C=O groups, CHO groups, COOH groups, and the like, and providing hydrophilic properties. If ultraviolet light is used to irradiate a substrate or the like obtained using polyester or polypropylene, OH groups or COOH groups are produced and hydrophilic properties afforded. If ABS, polypropylene, or the like has been treated with ozone, surface affinity is improved. If a degreasing treatment has been performed, the substrate surface is oxidized, replacement with hydrophilic groups is achieved, and hydrophilic properties are afforded. If an application treatment involving paraffin or the like has been performed, the coated region has affinity for nonpolar molecules, and is thus readily wettable if the fluid consists of nonpolar molecules.

In accordance with the above-described Embodiment 3, a film having affinity for the surface-modified pattern-forming region 703 is formed prior to the ejection of fluid from the ink-jet print head 2, creating only a slight danger of separation or excessive spreading for the droplets 12 (*8) impinging on the pattern-forming region.

Embodiment 4

Embodiment 4 of the present invention relates to a treatment for forming a region with no affinity on both sides of a pattern as a physical-chemical action, and is primarily used in the first arrangement described above.

Figure 8:
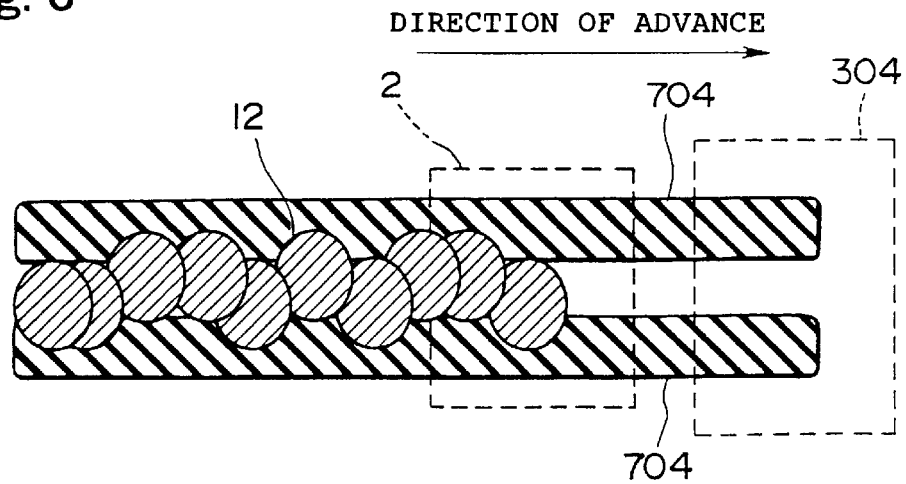
FIG. 8 is a plan view depicting the treatment concept of Embodiment 4.

FIG. 8 is a plan view illustrating the treatment concept of Embodiment 4. The treatment apparatus 304 of Embodiment 4 is configured to allow a film 704 with no affinity for the fluid to be formed in a region outside the pattern-forming region of the substrate 1.

The above-described methods for applying paraffin or the like can be cited as examples of treatments for forming a zero-affinity film when the fluid contains polar molecules. The following methods, which are described in Embodiment 3 above, can be used when the fluid is devoid of polar molecules: methods for applying silane coupling agents; methods for forming aluminum oxide, silica, and other porous films; and methods for performing reverse sputtering in argon or the like; as well as corona discharge treatments, plasma treatments, ultraviolet irradiation treatments, ozone treatments, degreasing treatments, and various other known methods.

Methods for forming films with no affinity for nonpolar molecules or films having affinity for polar molecules are the same as those in Embodiment 3 above, and their description will therefore be omitted.

According to Embodiment 4, a film 704 with no affinity for the fluid is formed on both sides of a pattern-forming region before the fluid is ejected from the ink-jet print head 2 as described above, so the fluid that has overflowed the pattern-forming region is repelled by the zero-affinity film 704, and can thus be confined to the pattern-forming region.

Embodiment 5

Embodiment 5 of the present invention relates to a treatment for forming a pattern-forming region to ensure fluid absorption as a physical-chemical action, and is primarily used in the first arrangement described above.

Figure 9:
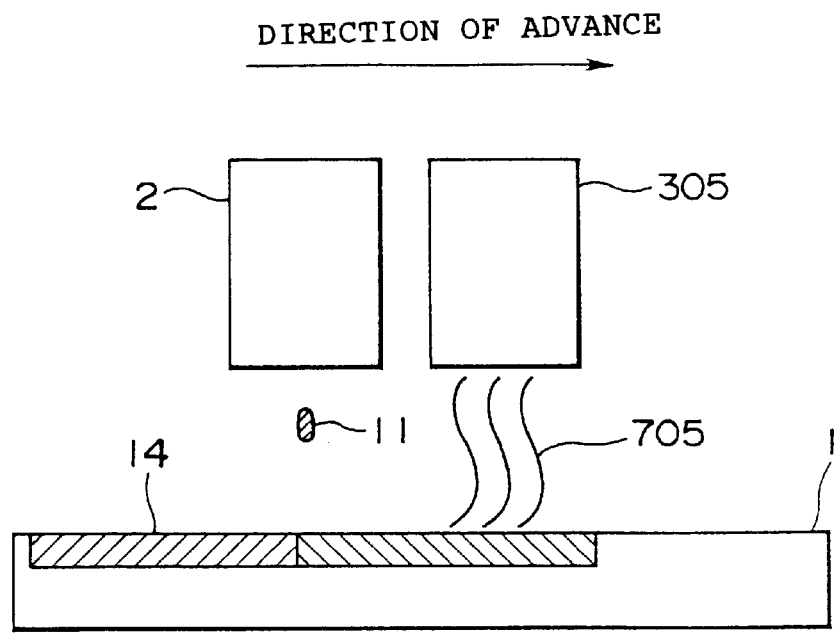
FIG. 9 is a side view depicting the treatment concept of Embodiment 5.

FIG. 9 is a side view illustrating the treatment concept of Embodiment 5. The treatment apparatus 305 of Embodiment 5 is configured such that an absorption layer 705 for absorbing fluids is formed in the pattern-forming region of the substrate 1.

Polyvinyl alcohol (PVA), polyvinyl acetate, or the like can be used for the absorption layer 705. It is believed that the treatment apparatus 305 should be equipped with an application mechanism resembling a ball-point pen in order to apply the polyvinyl alcohol.

In the aforementioned arrangement, the treatment apparatus 305 forms the absorption layer 705 prior to fluid ejection, and droplets 11 of a fluid are ejected from the ink-jet print head 2 onto the absorption layer 705 thus formed. The droplets 11 of the fluid thus ejected are partially absorbed by the absorption layer 705, and the fluid is fixed inside a layer 14. A pattern is thus formed in the region where the absorption layer has been formed.

According to Embodiment 5, the treatment apparatus 305 forms an absorption layer prior to the ejection of fluid from the ink-jet print head 2, allowing a pattern to be formed in accordance with the absorption layer, and excess fluid to be absorbed by the absorption layer.

Embodiment 6

Embodiment 6 of the present invention relates to a treatment for forming banks (in the form of dikes) that inhibit the outflow of fluid near the borders of the pattern-forming region as a physical-chemical action, and is primarily used in the first arrangement described above.

Figure 10:
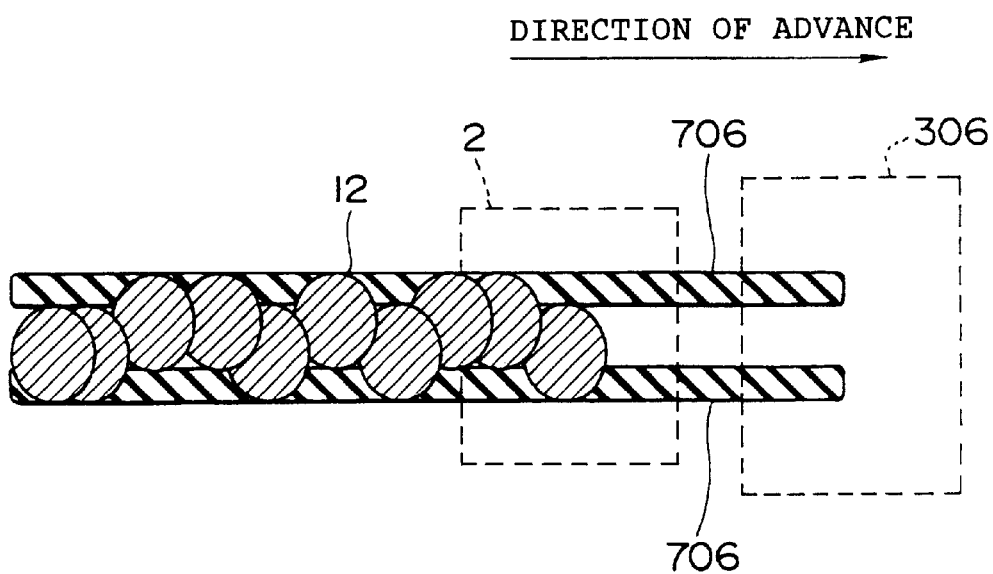
FIG. 10 is a plan view depicting the treatment concept of Embodiment 6.

FIG. 10 is a plan view illustrating the treatment concept of Embodiment 6. The treatment apparatus 306 of Embodiment 6 is configured to allow a plurality of banks 706 for inhibiting fluid outflow to be formed near the borders of the pattern-forming region on the substrate 1. A plurality of application mechanisms resembling ball-point pens are used as the treatment apparatus 306 because the bank material must be formed to a specific height. Each application mechanism is disposed in the width direction of the pattern-forming region at a distance equal to the width thereof. Polyimides, acrylic resins, epoxy resins, and the like can be suggested as the materials for the banks 706.

The treatment apparatus 306 thus configured gradually forms banks 706 prior to fluid ejection. When fluid droplets 11 are ejected in the pattern-forming region following bank formation, the presence of the banks 706 prevents the fluid from escaping beyond the banks. The fluid solidifies in the pattern-forming region enclosed within the two banks.

It is preferable that a step for removing the banks 706 following fluid solidification be provided. This is because the banks are no longer needed once the fluid has been fixed as a pattern. Plasma ashing, etching, or another method may be used for such bank removal.

According to Embodiment 6, the fluid can be prevented from escaping beyond the pattern-forming region because the banks are formed prior to the ejection of fluid from the ink-jet print head. Bank width can be kept small by removing the banks following pattern fixing.

Embodiment 7

Embodiment 7 of the present invention relates to a treatment for arranging the ejected fluid as a physical action, and is primarily used in the second arrangement described above.

Figure 11A:
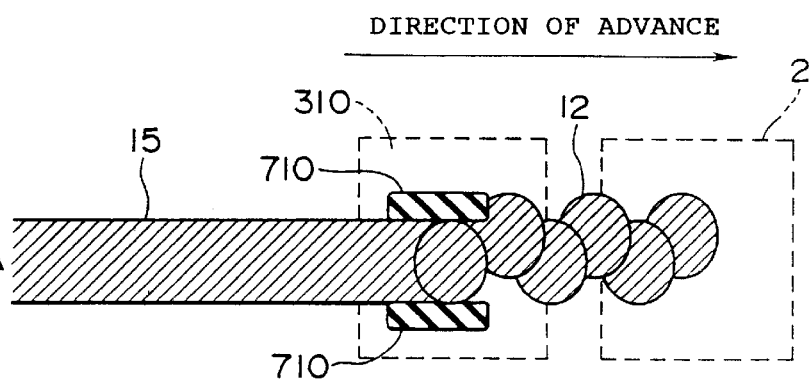
FIG. 11 is a diagram depicting the treatment concept of Embodiment 7, where (a) is a plan view, and (b) is a side view.
Figure 11B:
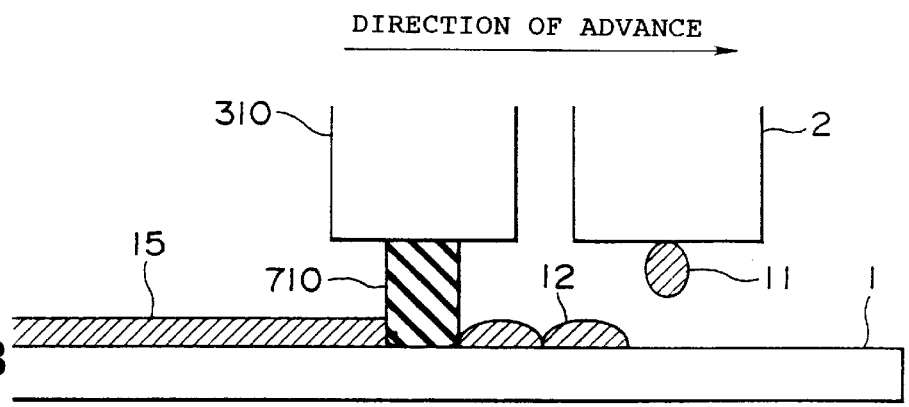

FIG. 11 is a diagram depicting the treatment concept of Embodiment 7, where FIG. 11A is a plan view, and FIG. 11B is a side view. The treatment apparatus 310 of Embodiment 7 is provided with a plurality of needle members 710 in order to ensure that the fluid 12 impinging on the substrate 1 is distributed along the borders of the pattern-forming region by rubbing. Each needle member 710 is disposed in the width direction of the pattern-forming region at a distance equal to the width thereof. The needle members 710 should preferably have specific mechanical strength, yet be sufficiently elastic to prevent substrate damage. The needle members 710 therefore consist of a resin, rubber, soft metal, or other such material.

When the ink-jet print head 2 ejects a fluid onto a substrate in the arrangement described above, the pattern-forming region is struck in a ejection direction that contains errors, albeit small. Consequently, the impact positions have borders that fall outside the pattern-forming region in some areas even when the positions themselves are substantially aligned with the longitudinal direction of the pattern-forming region. The treatment apparatus 310 distributes the overflowing fluid 12 along the borders of the pattern-forming region by rubbing, returning the overflowed portions back to the confines of the pattern-forming region and forming a pattern 15 of specific width.

According to Embodiment 7, a regularly shaped pattern can be formed because the treatment apparatus 310 arranges the pattern in an orderly fashion even if the droplets of fluid previously ejected by the ink-jet print head 2 have misaligned impact positions.

Embodiment 8

Embodiment 8 of the present invention relates to a treatment for absorbing excess impact fluid as a physical action, and is primarily used in the second arrangement described above.

Figure 12A:
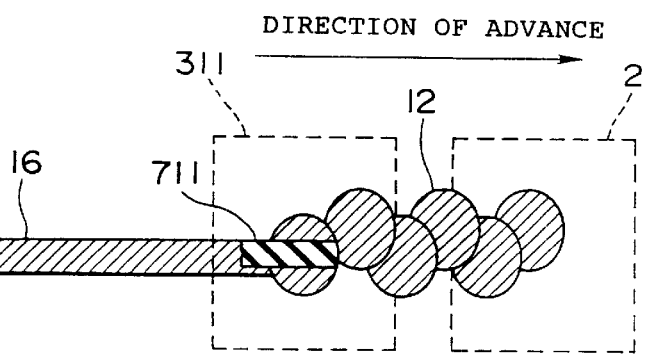
FIG. 12 is a diagram depicting the treatment concept of Embodiment 8, where (a) is a plan view, and (b) is a side view.
Figure 12B:
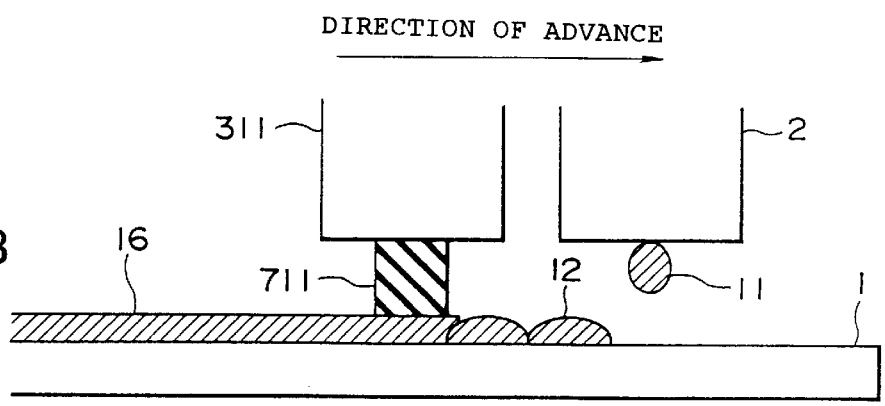

FIG. 12 is a diagram illustrating the treatment concept of Embodiment 8, where FIG. 12A is a plan view, and FIG. 12B is a side view. The treatment apparatus 311 of Embodiment 8 comprises an absorbing member 711 that moves along the pattern-forming region and is configured to allow excess fluid 12 impinging on the substrate 1 to be absorbed. The absorbing member 711 should preferably be shaped as a pipe capable of absorbing excess fluid. It is also possible to adopt an arrangement in which the absorbed fluid can be ejected again from the ink-jet print head 2. The absorbing member 711 should preferably have specific mechanical strength, yet be sufficiently elastic to prevent substrate damage. The absorbing member therefore consists of a resin, rubber, soft metal, or other such material.

The pattern is more difficult to disrupt when an excess of fluid is ejected from the ink-jet print head 2. Droplets of excess fluid fall outside the necessary pattern-forming region, however. In the present embodiment, the absorbing member 711 of the treatment apparatus 311 gradually absorbs excess fluid immediately after droplets of the fluid impinge on the substrate. Consequently, the fluid is prevented from spreading beyond the pattern-forming region. In addition, the fluid material can be conserved by returning the absorbed fluid to the ink-jet print head 2.

Embodiment 9

Embodiment 9 of the present invention relates to a treatment for discharging a fluid with a time difference as a physical action, and is primarily used in the first and second arrangements described above.

Figure 13:
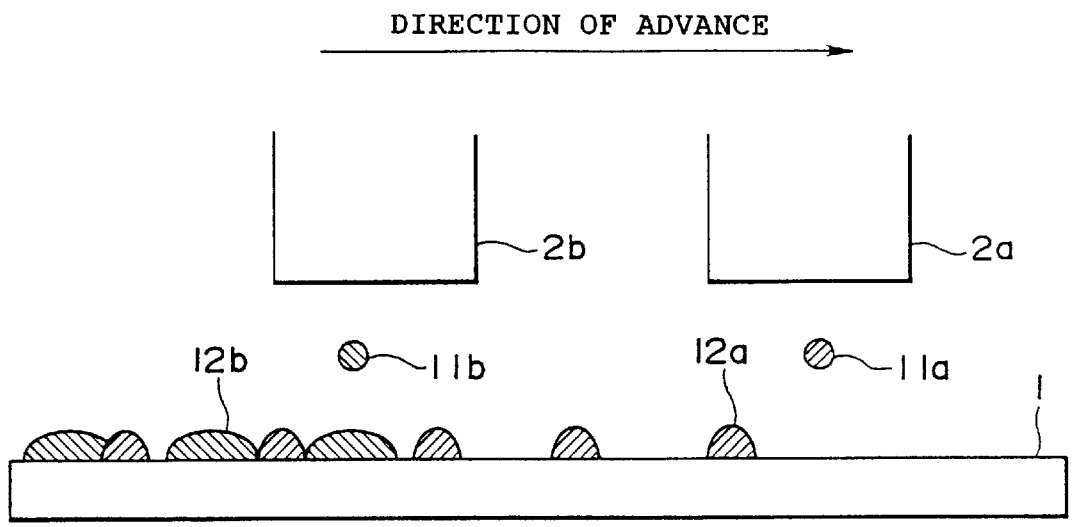
FIG. 13 is a side view depicting the treatment concept of Embodiment 9.

FIG. 13 is a side view illustrating the treatment concept of Embodiment 9. In Embodiment 9, ink-jet print heads 2 configured to allow fluids to be ejected are provided as treatment apparatus. Specifically, this arrangement involves disposing at a specific distance ink-jet print heads 2 for discharging the same fluid, and allows the fluid to be ejected within the same pattern-forming region in a relative back and forth manner.

In the above arrangement, a front ink-jet print head 2a ejects droplets 11a such that the impact marks 12a of the fluid are disposed at certain intervals on the pattern-forming region. A back ink-jet print head 2b ejects fluid droplets 11b in a controlled manner to arrive at an amount sufficient for the pattern-forming region to be filled with the fluid in combination with the already deposited fluid 12a. Surface tension acts on the previously deposited fluid 12a, as it does on the subsequently deposited fluid 12b. When other droplets fall on the droplets experiencing surface tension, the surface tension prevents the two types of droplets from intermixing, and the subsequently falling droplets slide on the previously deposited droplets and fall along their peripheries. Consequently, the present embodiment allows droplets 11b (*10) of the subsequently ejected fluid to be deposited on the areas devoid of the previously deposited fluid 12a because the latter is deposited at prescribed intervals. The fluid is therefore deposited within the pattern-forming region at a constant density and without any gaps.

The above-described aspect may also be such that a single ink-jet print head 2 is provided, and a control circuit 5 is provided to allow reciprocating motion to be performed over the same pattern-forming region. This is because this arrangement provides the same effect in terms of discharging a fluid with a time difference. In this case, the benefit is that the number of heads can be reduced.

Because Embodiment 9 involves discharging a fluid with a time difference, the density of the liquid impinging on the substrate can be made uniform, and patterns of uniform thickness can be formed.

Embodiment 10

Embodiment 10 of the present invention relates to a treatment for raising the concentration of droplets by laser irradiation as a chemical action, and is primarily used in the third arrangement described above.

Figure 14:
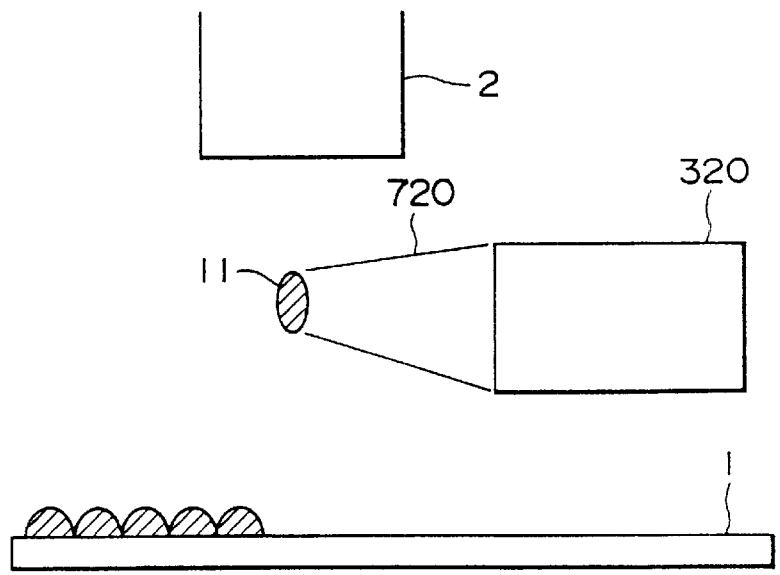
FIG. 14 is a side view depicting the treatment concept of Embodiment 10.

FIG. 14 is a side view illustrating the treatment concept of Embodiment 10. In Embodiment 10, the treatment apparatus 320 is configured in accordance with the third arrangement such that laser light 720 can be directed from the sides toward the droplets 11 of a fluid ejected by an ink-jet print head 2. Specifically, the treatment apparatus 320 comprises a laser light-emitting diode (not shown), a lens, and an actuator for irradiation with laser light. The laser light-emitting diode emits laser light of prescribed short wavelength as an energy source, and the lens is configured such that this laser light can be gathered on the droplets. The actuator is configured to allow the positions of the lens and the laser light-emitting diode to be corrected in order to properly focus laser light 720 on the droplets 11.

Although it is preferable for laser light to be used for irradiation as a means of supplying energy instantaneously, this is not the only option as far as supplying energy to the droplets is concerned. It is also possible to feed a hot blast, to perform irradiation with a lamp, to create an atmosphere, or to carry out any of a variety of other operations.

When fluid droplets 11 are ejected from the ink-jet print head 2 in the above-described configuration, laser light 720 emitted by the treatment apparatus 320 at a prescribed location is focused on the droplets 11. High energy can thereby be instantaneously imparted to the droplets 11. The temperature of the energized droplets 11 increases, raising the concentration of matter dissolved in the fluid or promoting film formation by the contained solids. The content of dissolved components whose presence is not needed before the impact is thus reduced, and the fluid impinges on the substrate 1 in the minimum composition required for pattern formation. Consequently, fluid concentration can be increased to a level suitable for pattern formation even when the fluid viscosity required for ejection from an ink-jet print head is lower than the fluid viscosity suitable for pattern formation.

According to Embodiment 10, excessive spreading of the fluid impinging on a substrate can be prevented and the elapsed time until pattern formation can be reduced because it is now possible to remove dissolved components whose presence is not needed before the impact of the droplets 11 ejected from the ink-jet print head 2.

Embodiment 11

Embodiment 11 of the present invention relates to a treatment for bending the trajectory followed by the droplets of a fluid by causing them to collide with other droplets as a physical action, and is primarily used in the third arrangement described above.

Figure 15:
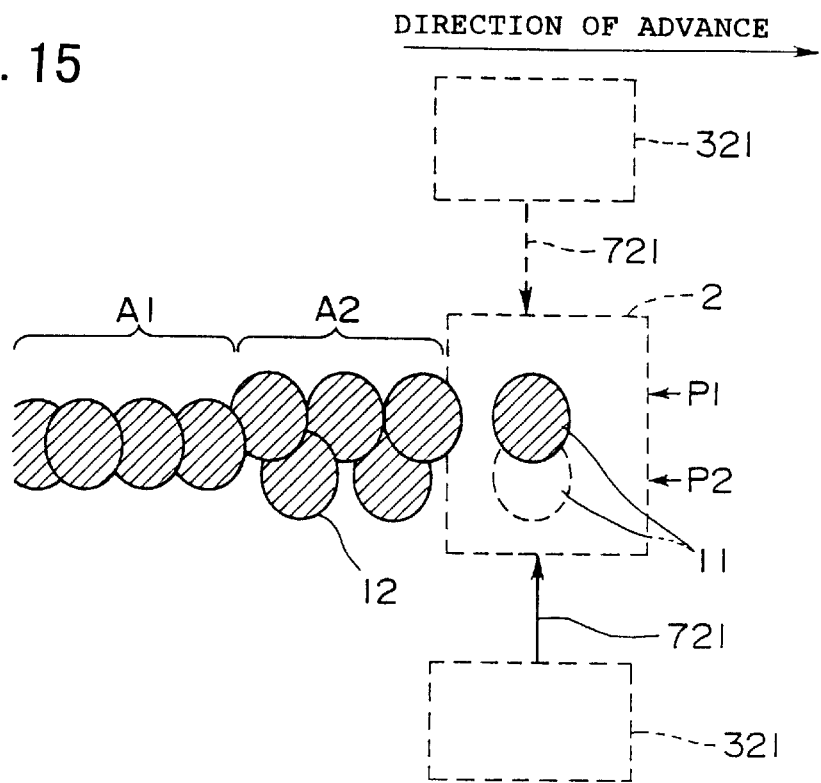
FIG. 15 is a plan view depicting the treatment concept of Embodiment 11.

FIG. 15 is a plain view illustrating the treatment concept of Embodiment 11. In Embodiment 11, the treatment apparatus 321 are disposed in accordance with the third arrangement in the direction perpendicular to the longitudinal direction of the pattern-forming region, facing each other across an ink-jet print head 2. Each of the treatment apparatus 321 is equipped with a structure capable of imparting energy to the droplets from a different direction. A structure capable of discharging prescribed droplets (for example, a structure similar to the ink-jet print head 2) is provided when the imparted energy is the mechanical energy resulting from collisions among prescribed droplets. The term "prescribed droplets" refers to reaction solutions for initiating the reactions described below when such chemical reactions are intended, and to the ejection of the same fluid as that ejected from the ink-jet print head 2 when the goal is not to initiate such reactions. A compressor, a nozzle, and other components for blowing air are provided when air is to be used as such energy. When an electric field is to be used as the energy, electrodes are installed on both sides of the trajectory followed by the droplets 11 of the fluid, and a power source is provided for applying voltage between the electrodes. When an electric field is used, a structure is also provided for charging positively or negatively the droplets 11 of the fluid ejected by the ink-jet print head 2.

When fluid droplets 11 are ejected from the ink-jet print head 2 in the structure described above, a control circuit 5 sends a control signal Sp to the treatment apparatus 321 and performs a control routine, forcing the fluid to impinge on a predetermined pattern area. When the treatment apparatus 321 is to eject predetermined droplets, the droplets are ejected by the treatment apparatus 321 in synchronism with the droplets 11 ejected by the ink-jet print head 2, the two types of droplets collide before they impinge on the substrate, and the impact positions of the droplets are changed. When the treatment apparatus 321 is to eject air, the air is blown in synchronism with the ejection of droplets from the ink-jet print head 2, and the trajectory followed by the fluid droplets is curved. When the treatment apparatus 321 is to apply an electric field, the droplets 11 from the ink-jet print head 2 are first charged, and the direction and magnitude of the electric field between the electrodes is adjusted based on the control signal Sp, making it possible to vary the impact positions of the droplets by an arbitrary amount of displacement in the direction of positive or negative electrode.

Patterns can be formed at any pattern width in accordance with the structure described above. As shown, for example, in FIG. 15, the feeding of control signals Sp is prohibited in area A1 (area of minimum pattern width), allowing the impact positions of the fluid droplets 11 to form consistent, finest patterns. On the other hand, in area A2 (area of large pattern width), control signals Sp are alternately sent to a plurality of treatment apparatus 321. Sending a control signal Sp causes the impact positions of the droplets to vary in accordance with the magnitude of the control signal. Applying, for example, a control signal to the control circuit 321a causes energy 721a to be supplied, and a droplet to be deposited at position P1. Applying a control signal to the control circuit 321b causes energy 721b to be supplied, and a droplet to be deposited at position P2. The impact positions change every time a droplet 11 is ejected if control signals Sp are alternately applied to the controls circuits 321a and 321b in synchronism with the control signals Sh sent to the ink-jet print head 2. As a result of this, a pattern-forming region whose width is greater than the diameter of deposited droplets can be filled with the fluid.

According to Embodiment 11, patterns of any pattern width can be formed by controlling the energy outputted by the control circuits 321.

Embodiment 12

Embodiment 12 of the present invention relates to a treatment for promoting chemical reactions by causing droplets of a reaction solution to collide with droplets of a fluid as a physical-chemical action, and is primarily used in the third arrangement described above.

Figure 16:
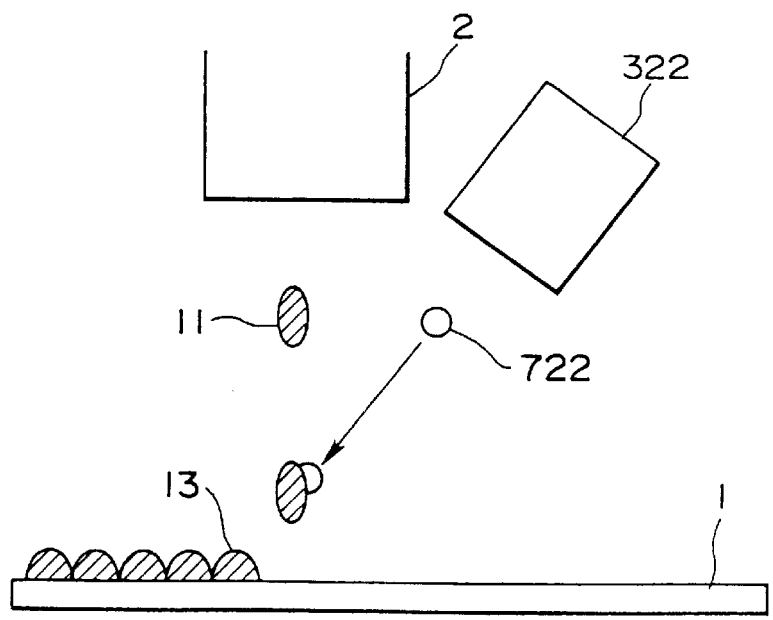
FIG. 16 is a plan view depicting the treatment concept of Embodiment 12.

FIG. 16 is a side view depicting the treatment concept of Embodiment 12. In Embodiment 12, the treatment apparatus 322 is configured in accordance with the third arrangement such that a reaction solution 722 can be mixed in the air with droplets exiting from an ink-jet print head 2. The treatment apparatus 322 may, for example, be configured in the same manner as the ink-jet print head 2 in order to eject the reaction solution in a controlled manner. The trajectory followed by the reaction solution 722 from the treatment apparatus 322 is adjusted to achieve a minimum acute angle in relation to the trajectory followed by the droplets 11 from the ink-jet print head 2. This is because a more acute angle prolongs the time during which the two types of droplets can remain in contact. The control circuit 5 is configured to allow control signals Sp to be sent to the treatment apparatus 322 in synchronism with the control signals Sh sent to the ink-jet print head 2.

When fluid droplets 11 are ejected from the ink-jet print head 2 in the structure described above, a reaction solution 722 is ejected substantially simultaneously from the treatment apparatus 322. The two types of droplets are brought into contact before they reach the substrate 1, a chemical reaction or the like is initiated, and the droplets impinge on the substrate 1 during or after the reaction.

According to Embodiment 12, it is possible to initiate reactions in the air. This approach poses problems when reactions occur during ejection, but is suitable for cases in which reactions occur during impact. It may, for example, be suitable for cases in which solidification starts or corrosion develops when a reaction occurs.

Embodiment 13

Embodiment 13 of the present invention relates to a detection and correction treatment of fluid droplets, and is primarily used in the third arrangement described above.

Figure 17:
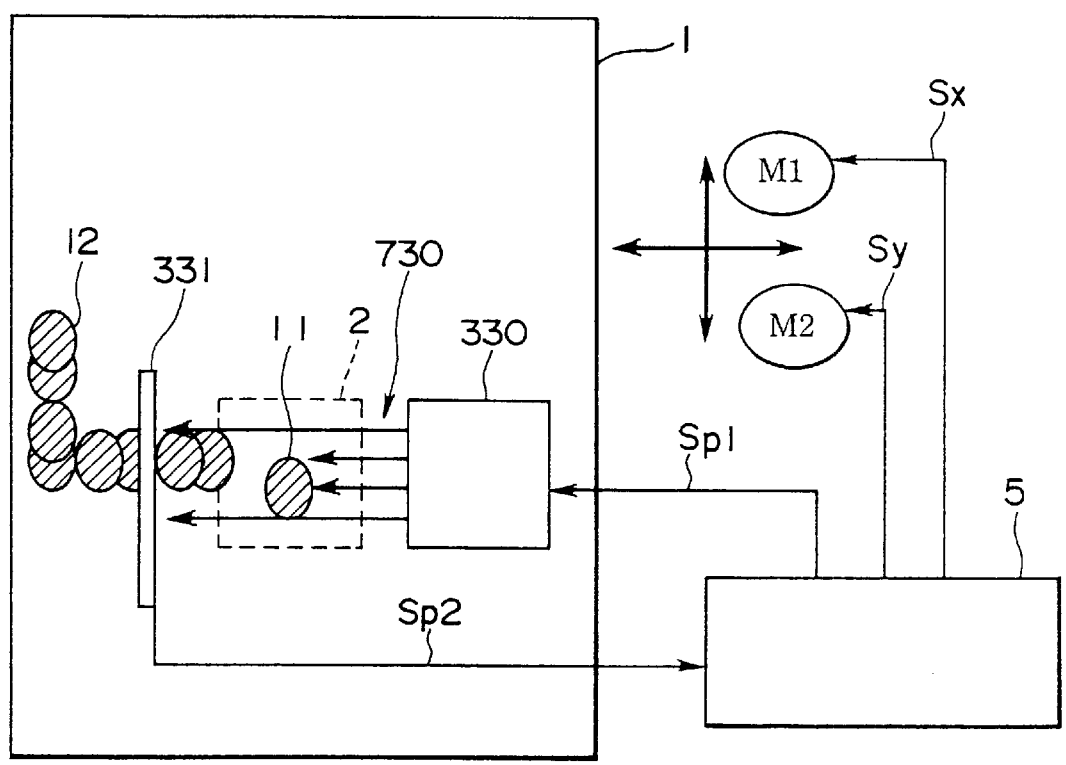
FIG. 17 is a diagram of the treatment concept of Embodiment 13.

A block diagram of Embodiment 13 is shown in FIG. 17. This drawing has substantially the same structure as in FIG. 1, and is different in that a treatment apparatus 330 and a detection means 331 thereof are provided. The treatment apparatus 330, which may, for example, comprise a laser light-emitting diode, a lens, an actuator, and the like, is configured such that laser light or another type of light with good rectilinear propagation properties can be directed in accordance with a control signal Sp1 across the trajectory of the droplets 11 ejected from the ink-jet print head 2. The detection means 331, which may, for example, comprise a photodetector, is configured such that light emitted by the treatment apparatus 330 can be detected. The control circuit 5 is configured to allow detection signals from the detection means 331 to be received, and the ejection timing, position, direction, speed, size, and other attributes of the droplets 11 to be detected. The arrangement also allows changes in characteristics brought about by the use of the ink-jet print head 2 to be fed back to the control signals. If, for example, the ejection timing has shifted away from to its standard value, the timing of the control signal Sh for controlling the ejection of fluid from the ink-jet print head 2 is corrected to compensate for this shift. Because the impact positions of droplets shift when the position or direction has shifted, a drive signal Sx for motor M1 or a drive signal Sy for motor M2 is sent in order to compensate for this shift. The relative position of the ink-jet print head 2 with respect to the substrate 1 can thereby be corrected, and the droplets can be deposited at appropriate positions along the pattern-forming region. Detection of droplet speed involves performing calculations in accordance with the width of the pulse within a detection signal Sp2. Specifically, it is believed that because the photodetector has a set detection surface area, the speed is higher if the pulse formed by a passing droplet is narrower, and lower if the pulse is wider. These correspond to a linear dependence. If the droplet speed has shifted away from its standard value, the droplets are deposited on the substrate faster or slower than normal. The control circuit 5 sends a control signal Sy to the motor M2 for adjusting the relative position in the direction of the Y-axis in order to compensate for this shift. The desired size is detected based on the pulse width of the detection signal Sp2. The reason for this is that level fluctuations within the detection signals increase because the surface area traveled by light increases with an increase in the diameter of the droplets. Because the droplets cannot be appropriately deposited when their size shifts beyond a permissible value, the control circuit 5 performs a step whereby the head is cleaned or a warning is issued.

According to Embodiment 13, the trajectory of droplets from an ink-jet print head is detected and corrected, making it possible to accurately form patterns even when the head is develops problems or when its characteristics have changed as a result of prolonged use.

Other Modifications

The present invention can be used after being modified in a variety of ways irrespective of the embodiments described above. Specifically, the scope of ideas pertaining to the present invention includes, in addition to cases in which a fluid is ejected from an ink-jet print head, cases in which treatments are performed before ejection, after ejection, or before the droplets impinge on the substrate. For example, pattern formation was stated as an object in the embodiments described above, but this is not the only object. Various applications are possible as long as ink can be ejected from an ink-jet print head or the like and specific effects obtained, both in commercial and consumer applications.

The above-described embodiments may also be used individually, or a plurality of them may be used at the same time. In particular, a treatment should preferably be conducted using a plurality of treatment apparatus when pattern formation is completed as a result of a plurality of steps. For example, it is suggested that adherence of droplets to a substrate can be facilitated by performing surface modification with the aid of the treatment apparatus of the first arrangement before the droplets are ejected, the treatment apparatus of the third arrangement can be used to perform a treatment in which the attributes of the fluid droplets thus ejected are detected and the positions thereof are corrected, the droplets can be finally concentrated on the substrate with the aid of the treatment apparatus of the second arrangement, and the like.

According to the present invention, a structure is provided such that a treatment can be performed before the fluid is ejected onto the substrate, allowing the formation of patterns by ink-jet systems to be promoted through pretreatments. It is therefore possible to dispense with bulky plant equipment and to form arbitrary patterns on substrates at a low cost.

According to the present invention, a structure is provided such that a treatment can be performed after the fluid has been ejected onto the substrate, allowing the formation of patterns by ink-jet systems to be promoted through after-treatments. It is therefore possible to dispense with bulky plant equipment and to form arbitrary patterns on substrates at a low cost.

According to the present invention, a structure is provided such that a treatment can be performed the moment a fluid is ejected, allowing energy to be imparted or causing droplets to undergo reactions in the air. It is therefore possible to dispense with bulky plant equipment and to form arbitrary patterns on substrates at a low cost.

The entire disclosure of Japanese Patent Application NO. 008016/1998 filed on Jan. 19, 1998 including specification, claims, drawings and summary are incorporated herein by reference in its entirety.

What is claimed is:

1. A pattern formation method for discharging a prescribed fluid onto a substrate from an ink-jet head and forming an arbitrary pattern, said pattern formation method comprising the steps of:

forming a pattern-forming region by subjecting the substrate to a specific treatment to prevent the fluid from spreading, the pattern forming region being formed in advance before the fluid is ejected, the pattern-forming region being narrower than a region over which the fluid is applied;

discharging the fluid onto the treated substrate from said ink-jet head; and forming the arbitrary pattern with the fluid in the pattern-forming region.

2. The pattern formation method according to claim 1, wherein said treatment is one that exerts chemical action on said fluid.

3. The pattern formation method according to claim 1, wherein said treatment is one in which the solubility of a prescribed substance contained in said fluid is lowered, and said substance is caused to precipitate.

4. The pattern formation method according to claim 1, wherein said treatment is one in which a substance that induces chemical reactions in said fluid is ejected onto said substrate.

5. The pattern formation method according to claim 1, wherein said treatment is one that exerts physical action on said fluid.

6. The pattern formation method according to claim 1, wherein said treatment is one that exerts physical-chemical action on said fluid.

7. The pattern formation method according to claim 1, wherein said treatment is one in which the area of said substrate around said pattern-forming region is surface-modified to eliminate any affinity for said fluid.

8. The pattern formation method according to claim 1, wherein said treatment is one in which said pattern-forming region on said substrate is surface-modified to achieve affinity for said fluid.

9. The pattern formation method according to claim 1, wherein said treatment is one in which said pattern-forming region on said substrate is surface-modified into an absorption layer for absorbing said fluid.

10. The pattern formation method according to claim 1, wherein said treatment is one in which banks for preventing said fluid from flowing out are formed around said pattern-forming region, and further comprises a step for removing said banks following the formation of said pattern.

11. A pattern formation method for discharging a prescribed fluid onto a substrate from an ink-jet head and forming an arbitrary pattern, said pattern formation method comprising the steps of:

discharging the fluid onto the substrate from the ink-jet head;

defining a pattern-forming region by subjecting the substrate to a specific treatment to prevent the fluid from spreading, the pattern forming region being formed after the fluid has been ejected so that the arbitrary pattern is formed in the fluid corresponding to the pattern-forming region, the treatment being one in which banks for preventing the fluid from flowing out are formed around the pattern-forming region; and removing the banks following the formation of the pattern.

* * * * *